United States Patent [19]

Gilboa et al.

[11] Patent Number: 5,108,569
[45] Date of Patent: Apr. 28, 1992

[54] PROCESS AND APPARATUS FOR FORMING STOICHIOMETRIC LAYER OF A METAL COMPOUND BY CLOSED LOOP VOLTAGE CONTROLLED REACTIVE SPUTTERING

[75] Inventors: Haim Gilboa, Palo Alto; Roderick Mosely, Mountain View; Hiroji Hanawa, Santa Clara, all of Calif.

[73] Assignee: Applied Materials, Inc., Santa Clara, Calif.

[21] Appl. No.: 746,302

[22] Filed: Aug. 13, 1991

Related U.S. Application Data

[63] Continuation of Ser. No. 666,498, Mar. 6, 1991, abandoned, which is a continuation of Ser. No. 444,063, Nov. 30, 1989, abandoned.

[51] Int. Cl.$^5$ ............................................. C23C 14/54
[52] U.S. Cl. ........................... 204/192.13; 204/192.12; 204/192.15; 204/192.16; 204/192.17; 204/298.03; 204/298.07; 204/298.08
[58] Field of Search ...................... 204/192.12, 192.13, 204/192.15, 192.16, 192.17, 298.03, 298.07, 298.08

[56] References Cited

U.S. PATENT DOCUMENTS

| 4,201,645 | 5/1980 | Riegert | 204/192.13 |
| 4,883,574 | 11/1989 | dos Santos Pereina Ribiero | 204/192.15 |

FOREIGN PATENT DOCUMENTS

| 228421A3 | 10/1985 | German Democratic Rep. | 204/298.07 |
| 45-4608 | 2/1970 | Japan | 204/298.07 |
| 62-287074 | 12/1987 | Japan | 204/298.07 |

OTHER PUBLICATIONS

Affinito et al., "Mechanisms of Voltage Controlled, Reactive, Planar Magnetron Sputtering of Al in Ar/N$_2$ and Ar/O$_2$ Atmospheres", *Journal of Vacuum Science Technology*, A 2(3), Jul.-Sep., 1984, pp. 1275-1284.

Hmiel, A. F., "Partial Pressure Control of Reactively Sputtered Titanium Nitride", *Journal of Vacuum Science Technology*, A 3(3), May/Jun. 1985, pp. 592-595.

McMahon et al., "Voltage Controlled, Reactive Planar Magnetron Sputtering of AlN Thin Films", *Journal of Vacuum Science Technology*, 20(3), Mar., 1982, pp. 376-378.

*Primary Examiner*—Aaron Weisstuch
*Attorney, Agent, or Firm*—John P. Taylor

[57] ABSTRACT

Process and apparatus are disclosed for forming a layer of a stoichiometric metal compound on a semiconductor wafer by reactive sputtering a metal target in a chamber in the presence of a reactive gas, wherein the negative potential on a metal target is increased or decreased to change the supply of sputtered metal atoms available to react with the atoms of the reactive gas at a fixed flow of the gas by resetting the power level of a constant power source electrically connected to the target and a path is provided for the flow of reactive gas to the zone between the target and the wafer, while restricting the travel of the stoichiometric metal compound being formed from the zone to thereby provide a stoichiometric ratio of sputtered metal atoms and reactive gas atoms adjacent the wafer to form the stoichiometric metal compound on the wafer.

The target potential is raised or lowered by resetting the power level of a constant power source by feeding a target voltage monitor signal back to the constant power source as a power level set signal, while the reactive gas path is provided by a series of nested members which provide a path for the reactive gas while restricting the backflow of the stoichiometric metal compound being formed.

32 Claims, 5 Drawing Sheets

FORMING A STOICHIOMETRIC METAL COMPOUND ON A SEMICONDUCTOR WAFER IN A CHAMBER BY REACTIVE SPUTTERING A METAL TARGET IN THE PRESENCE OF A REACTIVE GAS

CONTROLLING THE TARGET VOLTAGE TO PROVIDE A STOICHIOMETRIC AMOUNT OF SPUTTERED METAL ATOMS BY MONITORING THE TARGET VOLTAGE AND RESETTING THE POWER LEVEL OF A CONSTANT POWER SOURCE TO CHANGE THE TARGET VOLTAGE

PROVIDING A GAS FLOW PATH FOR THE REACTIVE GAS IN THE CHAMBER TO A ZONE BETWEEN THE TARGET AND THE WAFER WHILE RESTRICTING THE BACKFLOW OF THE METAL COMPOUND TO OTHER PARTS OF THE CHAMBER

PROCESS AND APPARATUS FOR FORMING STOICHIOMETRIC LAYER OF A METAL COMPOUND BY CLOSED LOOP VOLTAGE CONTROLLED REACTIVE SPUTTERING

This is a continuation of copending application Ser. No. 07/666,498 filed on Mar. 6, 1991, now abandoned, which is a continuation of copending application Ser. No. 07/444,063 filed on Nov. 30, 1989, now abandoned.

BACKGROUND OF THE INVENTION

1. Field of the Invention

This invention relates to the reactive sputtering of a layer of a metal compound on a substrate. More particularly, this invention relates to process and apparatus for reactive sputtering a layer of a stoichiometric metal compound on a semiconductor wafer including control of the voltage used to sputter the metal from a target, as well as expediting the flow of the reactive gas to the sputtered metal atoms to form the layer of stoichiometric metal compound.

2. Description of the Related Art

The sputtering of a metal target, such as, for example, a titanium target, using a power source such as, for example, a planar magnetron to provide a source of constant power, in a reactive gas atmosphere such as nitrogen ($N_2$), is a well known technique for high rate deposition of a film of a metal compound such as, for example, titanium nitride (TiN). However, control of such a reactive sputtering process, to both maximize the rate of deposition or film formation, as well as to control the film stoichiometry, has been difficult to achieve.

Reactive sputtering is a very versatile coating technique that allows the preparation of a wide variety of compound materials such as, for example, TiN, using a titanium target and $N_2$ as the reactive gas. However, it has traditionally had one major drawback. When the partial pressure of the reactive gas, such as $N_2$, reaches the right level to form a stoichiometric film of the metal compound on the surface of a substrate, it also forms the same metal compound on the surface of the metal target. This, in turn, causes the partial pressure of the reactive gas in the chamber to rise, since the formation of the metal compound on the surface of the target results in less of the target metal being available to react with the reactive gas in the chamber. This is due both to the sputter rate of the metal target being changed by the presence of the metal compound on the target surface, resulting in less metal ions being sputtered off the target and therefore available to react with the reactive gas, as well as a reduction of metal target surface available to react with the reactive gas.

Such changes in the stoichiometry of the constituents of the film of metal compound being formed, based on both the rise in reactive gas concentration, as well as the change in sputter rate of the target due to the formation of the metal compound thereon which, in turn changes the concentration of sputtered metal ions available to react with the reactive gas, result in an undesirable formation of film on the substrate which, while containing both sputtered metal atoms and reactive gas atoms, does not possess the proper stoichiometry to form a homogeneous layer of the desired stoichiometric metal compound.

It has previously been proposed to control the reactive sputtering of titanium to form a TiN film by monitoring the partial pressure of the $N_2$ in the chamber and to decrease the $N_2$ flow upon sensing an increase in nitrogen pressure. This is described more fully by H. F. Hmiel in "Partial Pressure Control of Reactively Sputtered Titanium Nitride", published in the *Journal of Vacuum Science Technology*, A 3(3), May/June 1985, at pages 592-595. The author describes the use of a quadrupole mass spectrometer together with microprocessor-controlled argon and nitrogen flow valves to control the flow of both argon and nitrogen into the sputtering chamber to control the sputtering process.

Unfortunately, the response time of this type of system is rather slow since the sampled gas from the sputtering chamber must be analyzed in the mass spectrometer for nitrogen content and the result then fed into the microprocessor which, in turn, must then adjust the flow of nitrogen into the sputtering chamber to eventually effect the desired change in nitrogen concentration in the chamber.

Prior to this, the control of reactive sputtering of AlN films using an aluminum target and an $Ar/N_2$ sputtering gas mixture was studied by McMahon, Affinito, and Parsons in "Voltage Controlled, Reactive Planar Magnetron Sputtering of AlN Thin Films", published in the *Journal of Vacuum Science Technology*, A 20(3), March 1982, at pages 376-378; and by Affinito and Parsons in "Mechanisms of Voltage Controlled, Reactive Planar Magnetron Sputtering of Al in $Ar/N_2$ and $Ar/O_2$ Atmospheres", published in the *Journal of Vacuum Science Technology*, A 2(3), July-Sept. 1984, at pages 1275-1284.

In those two articles, control of gas feed, power, current, and voltage to achieve formation of stoichiometric thin films of AlN by reactive sputtering of aluminum in an argon/nitrogen mixture is discussed. In the earlier article, the authors concluded that constant gas flow rates and control of the voltage was best suited for reactive planar magnetron sputtering of aluminum.

In the latter article (by two of the authors of the earlier article), the authors stated that they had previously found that a single valued, monotonic functional relationship exists between V (cathode voltage) and P (reactive gas partial pressure) for the $Al-Ar/N_2$ system, while a range exists where each value of I (current) corresponds to three values of V or P and that when the discharge was operated by controlling V, they were able to operate over the full range of I-V-P combinations. However, the authors then noted that subsequent experiments with Al, Zn, In, and Mo on $Ar/O_2$ atmospheres revealed that voltage control was not possible across the transition between bare metal and completely covered target states. They also noted that in $Ar/N_2$ atmospheres, control was not possible with Mo but wa possible with Zn.

There remains a need for improvement in the control of the process for the formation and deposition of a a layer of a stoichiometric metal compound on a semiconductor wafer by reactive sputtering.

SUMMARY OF THE INVENTION

It is, therefore, an object of this invention to provide a method and apparatus for improving the formation of a layer of a stoichiometric metal compound on a semiconductor wafer by reactive sputtering.

It is another object of this invention to provide a method and apparatus for improving the formation of a layer of a stoichiometric metal compound on a semiconductor wafer by reactive sputtering by resetting the power level of a constant power source to adjust the target voltage to maintain the reaction conditions within a range wherein the metal compound will be formed with the correct stoichiometry.

It is yet another object of this invention to provide a method and apparatus for improving the formation of a stoichiometric layer of a metal compound on a semiconductor wafer by reactive sputtering by providing a feedback loop from a target voltage monitoring signal to a power level set signal on a constant power source to adjust the target voltage to maintain the reaction conditions within a range wherein the metal compound will be formed with the correct stoichiometry.

It is still another object of this invention to provide a method and apparatus for improving the formation of a layer of a stoichiometric metal compound on a semiconductor wafer by reactive sputtering by providing means for transporting the reactive gas in a chamber into a zone between the metal target being sputtered and the wafer on which the reaction product of the sputtered metal and the reactive gas is being deposited to enhance formation of the reaction product with the correct stoichiometry.

DETAILED DESCRIPTION OF THE INVENTION

The invention comprises method and apparatus for forming and depositing on a semiconductor wafer a layer of a stoichiometric metal compound formed by sputtering a metal from a target in the presence of a reactive gas.

The invention includes process and apparatus for adjusting and controlling the target voltage to control the reaction conditions for forming the layer of the stoichiometric metal compound by reactive sputtering.

The invention also includes process and apparatus for transporting a sufficient amount of the reactive gas into the zone between the target being sputtered and the wafer on which is being formed the layer of the stoichiometric reaction product of the reactive gas and the metal being sputtered.

The term "reactive gas", as used herein, is intended to define a gas capable of reacting with metal ions sputtered from a metal target to form a metal compound, and which is supplied to the zone between a metal target being sputtered and a wafer on which the resultant stoichiometric product will be formed to permit reaction and formation of a stoichiometric reaction product.

The term "reactive sputtering" is intended to define a sputtering process in which sputtering of a metal target takes place in the presence of a reactive gas capable of reacting with the resulting sputtered metal ions to form a reaction product which forms as a layer on the surface of a semiconductor wafer.

By use of the term "stoichiometric compound" is meant the reaction product of a metal atom or atoms with a reactive gas atom or atoms to form a chemical compound in contrast to a deposit of a physical mixture of the atoms on the wafer. The layer formed on the wafer is deemed to be a stoichiometric compound if it contains only single phase material, e.g., 50 atomic % titanium, and 50 atomic % nitrogen.

Although the invention will be described in connection with the reactive sputtering of a titanium metal target in the presence of a reactive nitrogen gas, it should be realized that this is by way of illustration and not of limitation.

The reactive sputtering process and apparatus which will be described for forming a stoichiometric titanium nitride layer on a semiconductor wafer, including the method and means for controlling the target voltage and the method and means for transporting the reactive gas into the zone between the target and the wafer, may be equally applicable to the formation by reactive sputtering of other metal compounds on semiconductor wafers.

For example, the sputtered metal, in addition to titanium, may comprise Al, Si, Ta, Cu, and Zn; while the reactive gas, in addition to nitrogen, may comprise $O_2$, silane ($SiH_4$), and $N_2O$.

Figure 1:
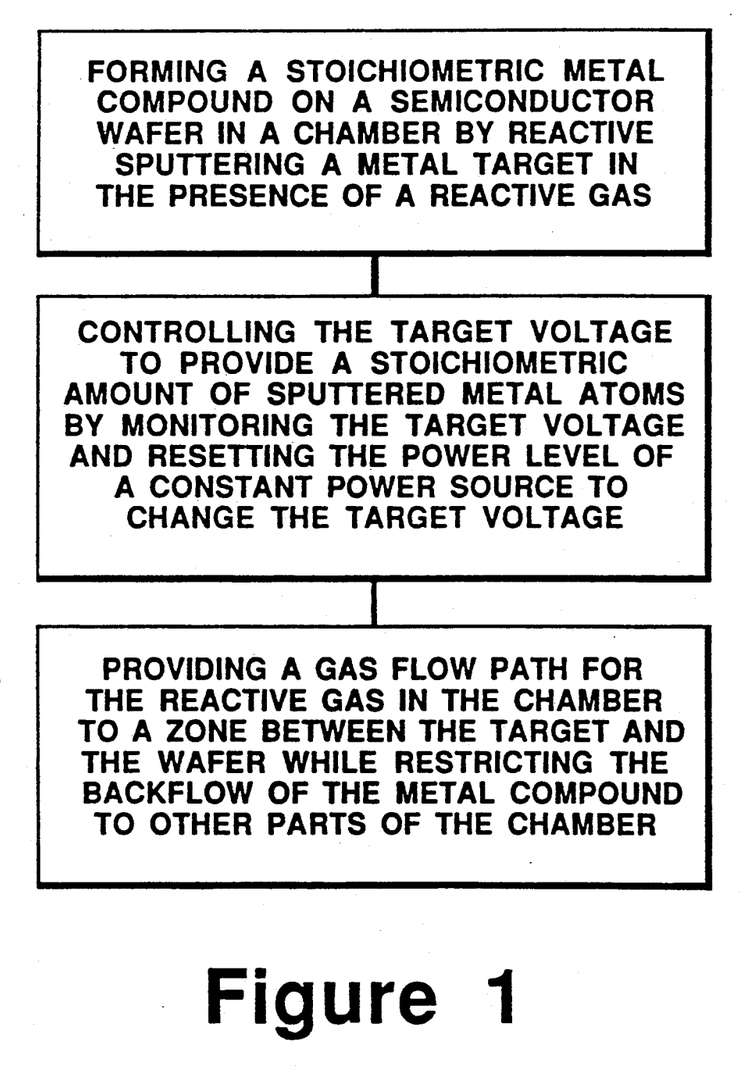
FIG. 1 is a flow sheet illustrating the process of the invention.
Figure 2:
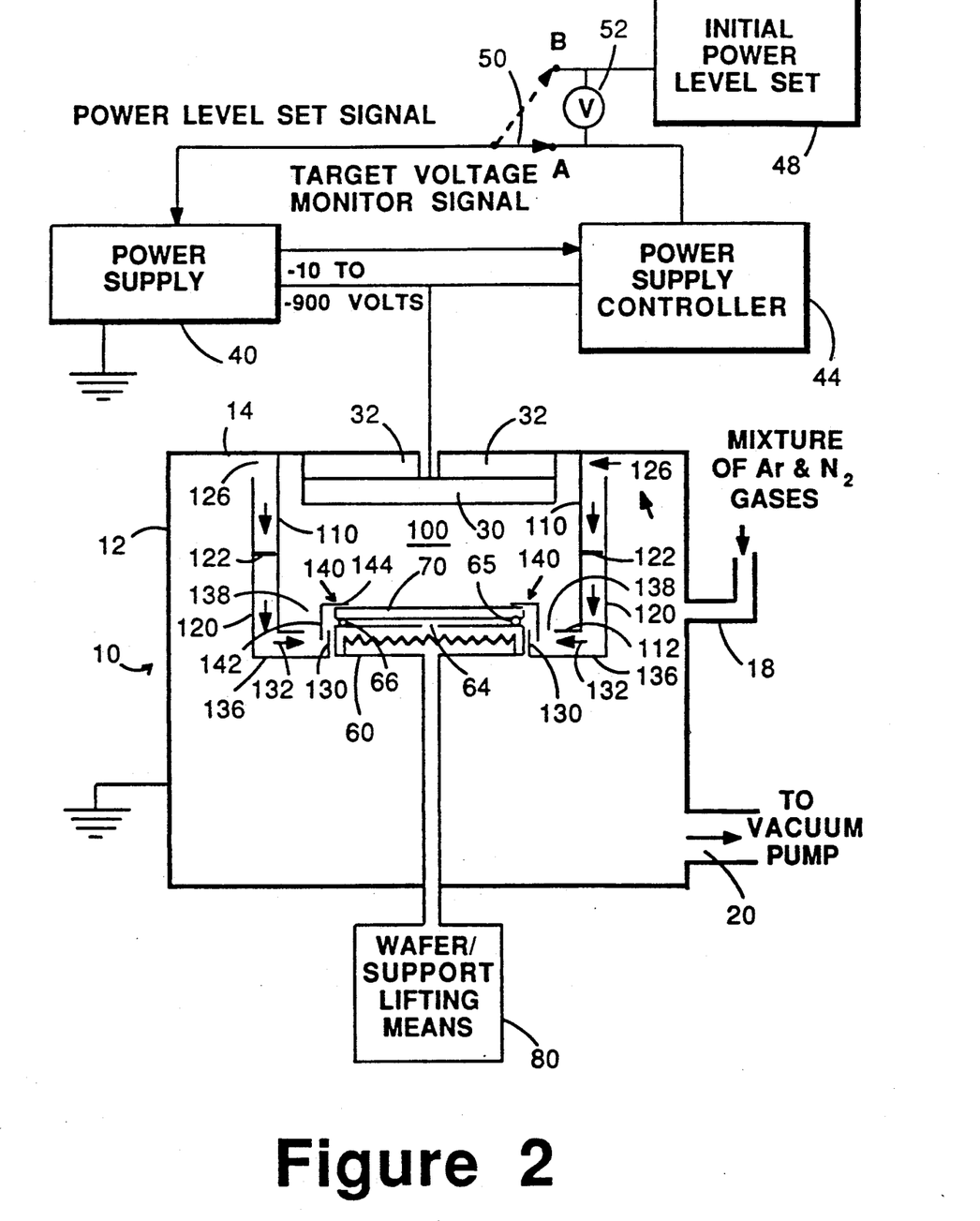
FIG. 2 is a vertical cross-section of the reactive sputtering apparatus generally used to form and deposit a stoichiometric compound by reactive sputtering, showing in particular the passage means used to supply the reaction zone between the target and the wafer with a sufficient amount of the reactive gas to achieve formation and deposit of a stoichiometric layer of the reaction product of the sputtered metal and the reactive gas.

FIG. 2, which will be referred to in more detail below, shows in general the apparatus used in the reactive sputtering process. A chamber 10, having a top wall 14, is provided with a gas inlet 18, through which a mixture of a sputtering gas, such as argon, and a reactive gas, such as nitrogen, may be fed into chamber 10.

Chamber 10 is also provided with an outlet port 20 which is connected to a vacuum pumping means (not shown) to maintain a vacuum in chamber 10 within a range of from about $1 \times 10^{-7}$ Torr to about $1 \times 10^{-9}$ Torr.

Mounted to top wall 14 of chamber 10 via insulators 32 is a target 30 comprising the metal to be sputtered, e.g., titanium. The target, such as a planar magnetron, is connected to the negative terminal of a constant power grounded power supply 40, which supplies a constant power within a range of from about 500 to about 15,000 watts, to the target at a negative voltage which may range from about $-250$ to about $-750$ volts, preferably from about $-300$ to about $-400$ volts.

Chamber 10 also contains a wafer support platform 60 which contains heating means 62 to maintain the wafer at a temperature within a range of from about 25°

C. to about 500° C., preferably from about 300° C. to about 500° C., and typically about 450° C., during the reactive sputtering process.

Platform 60 further includes a gas port 64 for admitting a gas such as argon to the backside of a wafer 70 which is sealingly mounted to the upper surface of platform 60. The gas functions to thermally couple the wafer to the support platform for heating and cooling purposes. After wafer 70 is loaded onto platform 60 in chamber 10, the platform and wafer are raised by lifting means 80 to the position shown in FIG. 2.

To start the sputtering process, a sputtering gas such as argon, with or without the reactive gas, is admitted into the chamber through entrance port 18 and a plasma is ignited between the target and the grounded walls of chamber 10. The ionized argon atoms in the plasma bombard titanium target 30, causing titanium ions to be sputtered from the surface. If the reactive gas flow has not already commenced, flow of the reactive gas such as nitrogen is then started, resulting in reaction between the reactive nitrogen gas and the sputtered titanium ions on or adjacent the semiconductor wafer, resulting in a deposit of a layer containing both titanium and nitrogen atoms.

Typically, the flow of the sputtering gas will range from about 30 to about 150 standard cubic centimeters/minute (sccm), while the flow of the reactive gas will range from about 30 to about 150 sccm. The exact amount of flow into the chamber of the gases in the mixture will also be dependent on other factors such as the chamber size and the capacity of the vacuum pumping system.

The process may be carried out over a time period which is related to the rate of deposition and the desired thickness of the layer of metal compound being formed. The rate of deposition will usually vary from about 500 Angstroms per minute to about 5000 Angstroms per minute. The thickness of the deposited film of metal compound will usually vary from about 500 Angstroms to about 2000 Angstroms.

Figure 3:
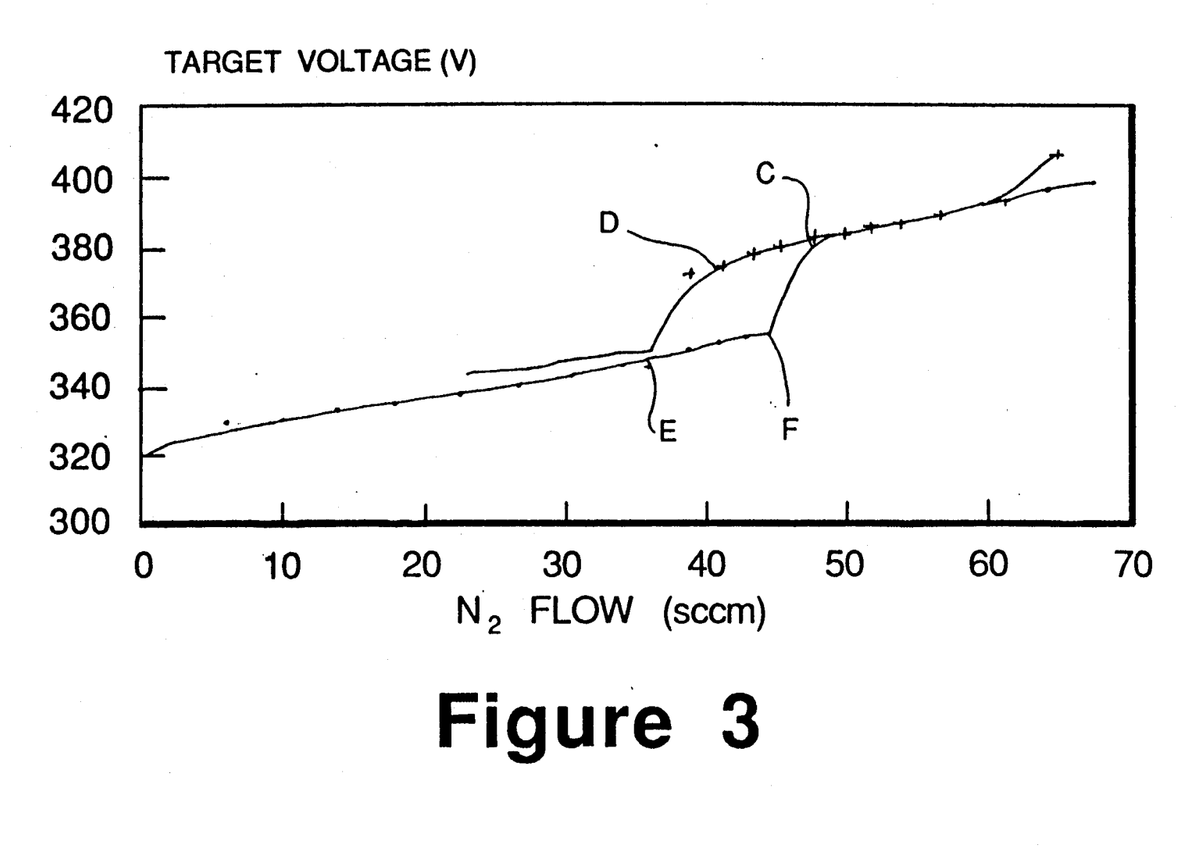
FIG. 3 is a graph showing the desired operating range of target voltage of a titanium metal target and reactive nitrogen gas flow for forming and depositing a stoichiometric layer of TiN.

Referring now to the graph of FIG. 3, the target voltage used to sputter the titanium target is shown plotted against the flow of nitrogen, as the reactive gas, into chamber 10 in which the reactive sputtering process is taking place.

In this graph, the line shown with points depicts the reaction as the titanium target is being initially sputtered to produce titanium ions which react with the nitrogen atoms in the nitrogen gas to form titanium nitride. As the voltage increases and the flow of nitrogen also increases, some of the nitrogen begins to react with the titanium target to form titanium nitride on the surface of the target, commencing at point E, which then results in a sudden rise in the target voltage, as shown at point F on the graph, due to the use of a constant power source and the increased resistance of the titanium nitride layer, resulting in a drop in current flow.

The sputtering process then enters a so called "poisoned" mode wherein the titanium target with the layer of titanium nitride thereon continues to be sputtered resulting in continued production of at least titanium ions available to react with the nitrogen atoms, as well as some sputtering of the titanium nitride being formed on the target surface.

However, it has been found, by analyzing the resultant deposited layer, that the deposited layer containing both titanium and nitrogen, which is being formed on the substrate, is not the desired stoichiometric TiN, either prior to the sudden rise in target voltage or after this point. Under the reaction conditions of target voltage and nitrogen flow plotted between point E and point F, the deposited reaction product will be too rich in titanium since principally titanium, with little if any titanium nitride, is being sputtered from the target.

In contrast, under the reaction conditions to the right of point F on the line with points, i.e., after the sudden rise in target voltage, the reaction product will be too rich in nitrogen due to the increase in nitrogen flow and the decrease in available sputtered titanium ions.

At this point, either the nitrogen gas flow may be lowered or the target voltage reduced by the operator to reverse the sequence. However, as shown by the line in the graph having crosses on it, the reversal of process conditions does not track the previous plot, but rather slowly drops in both target voltage and nitrogen flow until reaching point D at which time both the nitrogen flow and the voltage begin to quickly drop.

It has been found that if the target voltage and the nitrogen flow rate can be maintained in a range between points C and D, as noted on the curve with crosses, that a layer of a stoichiometric TiN product can be formed on a semiconductor wafer.

While formation of a stoichiometric TiN was recognized in the prior art as attainable by control of the nitrogen flow, in accordance with the invention, the reaction conditions are instead controlled by maintaining the voltage level on the target in the range between points C and D on the graph, i.e., between about 370 to about 385 volts, by monitoring the target voltage and then resetting the power level of the constant power source connected to the target being sputtered to obtain the desired target voltage.

Figure 4:
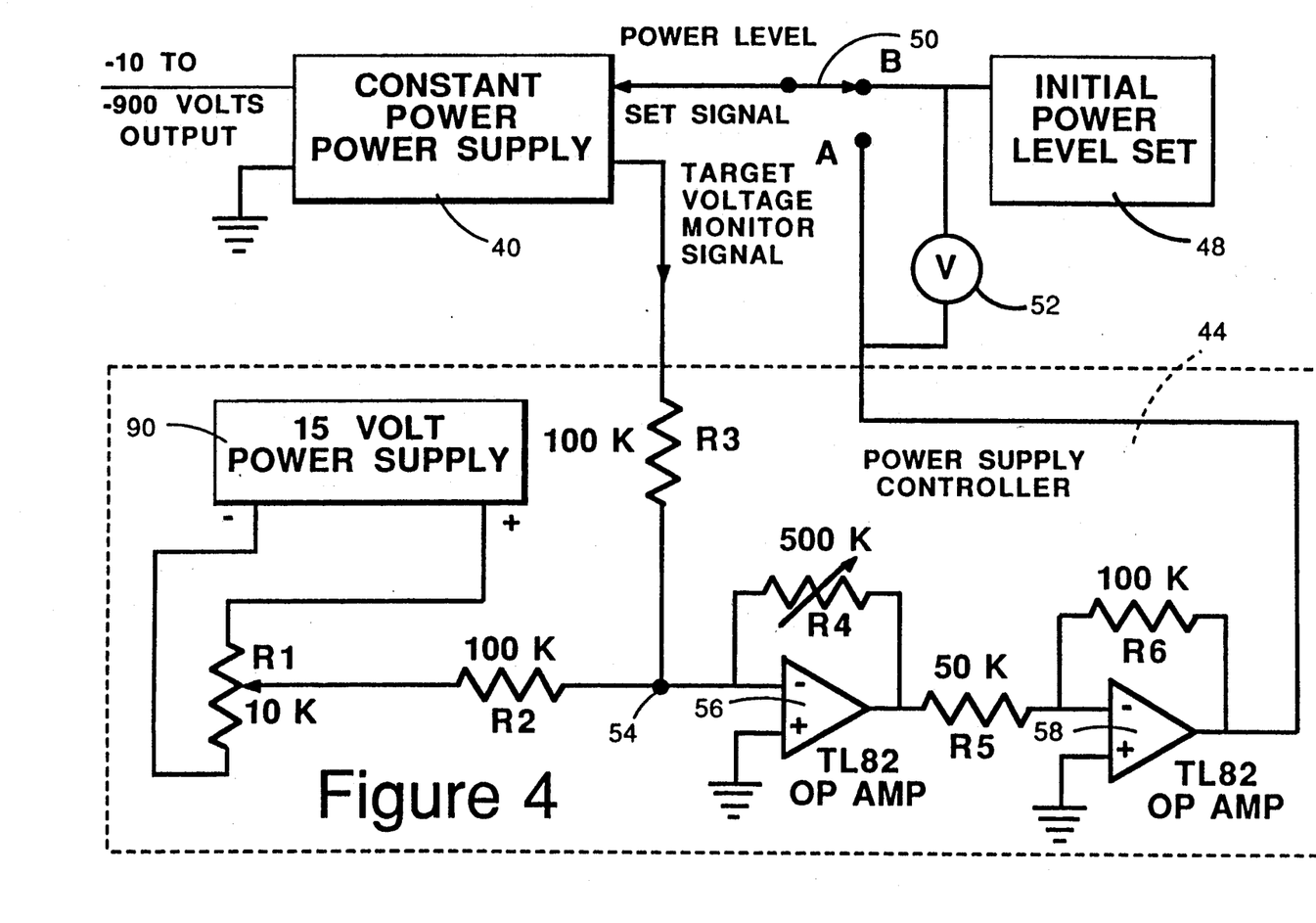
FIG. 4 is a electrical schematic of the circuitry used to provide control of the target voltage to maintain the process within the desired operating range for forming and depositing a stoichiometric layer of TiN.

Referring now to the schematic of FIG. 4, the circuitry used to control the constant power source or power supply 40 is shown. Power source 40, which comprises a constant power grounded power supply, such as Model MDX 10 Constant Power Supply by Advanced Energy Industries, is provided with a power set input terminal through which a signal may be fed into the power supply to set the constant power level.

As shown in FIGS. 2 and 4, the power set signal may be initially fed into power supply 40 from an initial power set source 48 by setting switch 50 to the B terminal connected to power set 48. This initial power set signal may comprise an adjustable voltage source ranging from 0 to 10 volts or it may be comprise a more sophisticated control mechanism such as a computer which may be used to monitor and control other process parameters such as temperature, pressure, etc. as well. In its simplest form power set 48 will simply comprise a signal at a voltage which may be empirically determined to provide the approximate power level needed to generally initiate the process within the range specified between points C and D in FIG. 3.

While switch 50 is in the B position, potentiometer R1, which is connected across 15 volt D.C. power supply 90, is adjusted to null or balance the voltage between points A and B so that voltmeter 52 reads zero. Switch 50 is then switched to point A and the feed back loop control of the power level of power supply 40 commences.

As shown in both FIGS. 2 and 4, power supply 40 is also provided with a voltage monitoring signal terminal at which a low voltage appears which is proportional to the output voltage of power supply 40 at the power level at which power supply supply 40 has been set via the power set signal.

This voltage monitor signal from power supply 40 is fed into the feedback control loop at point 54. Since the voltages appearing at both points A and point B are initially balanced with potentiometer R1, while switch 50 is set at point B, i.e., connected to the initial power set controller, the voltage level of the power set signal initially being fed back to power supply 40 just after switch 50 is moved to point A should not change.

However, when the target voltage monitor signal does change, reflective of a change in the current flow (since the power level will remain constant), the target voltage monitor signal being amplified by operational amplifiers 56 and 58 will change, resulting in a higher or lower power set signal being fed back to power supply 40 to change the constant power setting of power supply 40.

Thus, for example, when the voltage monitor signal begins to rise, indicative that the target voltage is rising, the higher voltage at point 54 results in a higher power set signal being fed back to power supply 40, resulting in a resetting of the constant power level to a higher level.

This, in turn, results in more titanium being sputtered, resulting in a lowering of the target voltage back to the desired voltage level, at which point the voltage monitor signal will then fall, resulting in a resetting of the power level again. Thus, each change in target voltage, reflective of a change in sputtering conditions and therefore changes in available sputtered titanium atoms to react with the constant flow of reactive nitrogen, will result in a change in the power level of power source 40 to return the target voltage back to a condition where the stoichiometry between the sputtered titanium atoms and the reactive nitrogen will be restored. Thus, formation and deposit on the wafer of a stoichiometric metal compound such as TiN is assured.

In addition to controlling the target voltage to ensure supply of a stoichiometric amount of titanium atoms for reaction with the reactive nitrogen gas, it is important that the flow of the reactive gas such as nitrogen into chamber 10 results in a sufficient amount of nitrogen atoms in the smaller zone noted as 100 in FIG. 2 between target 30 and wafer 70 to react with the sputtered titanium atoms. In other words, even though the overall flow of nitrogen atoms into chamber 10 may be that amount which will provide the desired stoichiometry, if a sufficient amount of the nitrogen atoms do not actually reach zone 100, the drop in voltage needed to match the corresponding amount of nitrogen (as calculated from the incoming flow into chamber 10) may result in an undesirable reduction in the actual formation and deposition rate of the TiN layer even though the desired stoichiometry is preserved, as well as possibly also affecting the desired stoichiometry.

In accordance with another aspect of the invention, method and means are, therefore, provided to efficiently transport the reactive gas from the outer portions of chamber 10 into the zone between target 30 and wafer 70, while inhibiting the flow and deposition of the reaction product of the sputtered metal and the reactive gas out of zone 100 to other portions of chamber 10 where it may deposit on the chamber walls which will magnify the extent of the periodic cleanup needed to remove such undesired deposits in the chamber.

Figure 5:
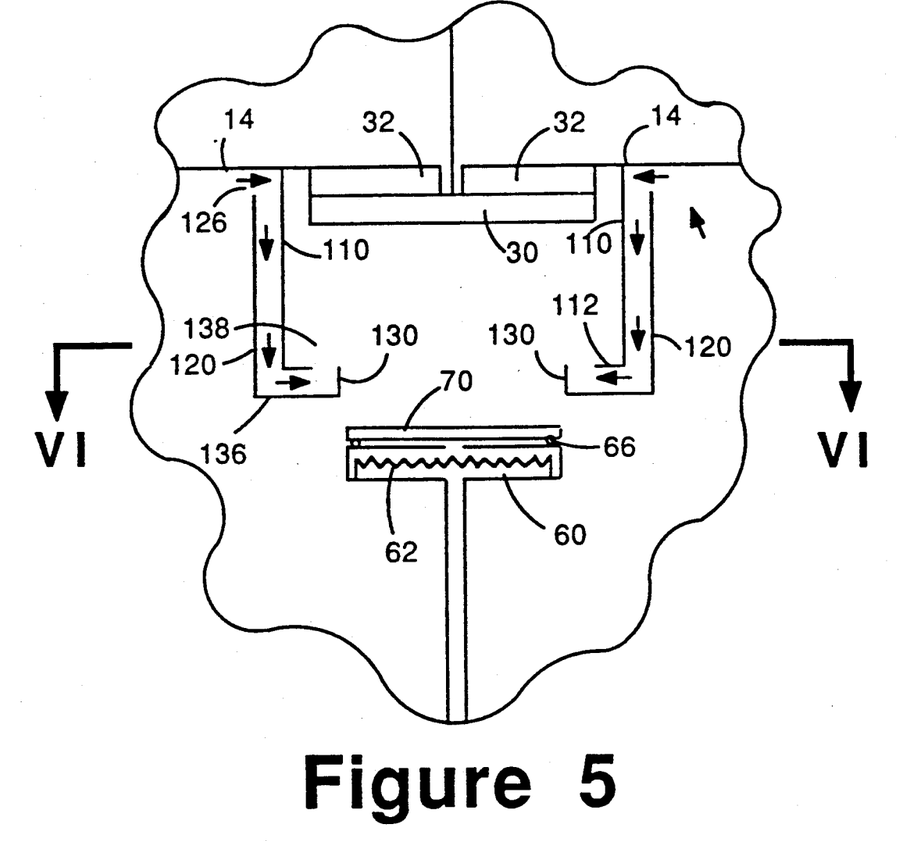
FIG. 5 is a fragmentary vertical cross-section of a central portion of the apparatus shown in FIG. 2 with the wafer shown in a loading position prior to being raised to a position where formation and deposition of the stoichiometric layer of the reaction product of the sputtered metal and the reactive gas will occur.
Figure 6:
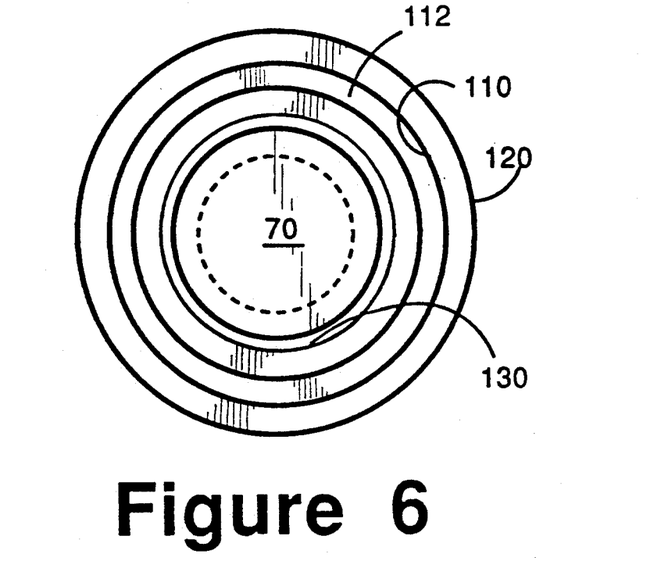
FIG. 6 is a top view of the structure shown in FIG. 5 taken along lines VI—VI with the clamping ring around the wafer omitted for purposes of clarity and the wafer shown in dotted lines to illustrate the positioning of the means for forming the passage for transporting the reactive gas into the zone between the target and the wafer.

Referring again to FIG. 2, as well as FIGS. 5 and 6, in accordance with this aspect of the invention a first cylindrical member 110 is provided depending downwardly from top wall 14 of chamber 10. Cylindrical member 110 is generally mounted to top wall 14 to symmetrically surround the sides of target 30 which is also mounted to top wall 14.

Cylindrical member 110 is shown coaxially nested within a second cylindrical member 120 which is spaced from top wall 14 of chamber 10 and is supported within chamber 10 by support pins 122 which extend to first cylindrical member 110. Second cylindrical member 120 extends downwardly toward the bottom of chamber 10 a distance greater than that of first cylindrical member 110.

A third cylindrical member 130, coaxially nested within first cylindrical member 110 and extending downwardly toward the bottom of chamber 10 a distance approximately equal to that of second cylindrical member 120, is connected to and supported by second cylindrical member 120 via a bottom wall 136 which is sealingly joined to the respective bottom cylindrical edges of both second cylindrical member 120 and third cylindrical member 130.

The top end of third cylindrical member 130 is positioned down from target 30 a distance approximately equal to the desired spacing of wafer 70 from target 30. Carried on the top end of third cylindrical member 130 is a clamping means 140 which is adapted to grasp the outer periphery of the top surface of wafer 70 and sealingly urge it against sealing means 66 peripherally carried on the top surface of wafer support platform 60.

Clamping means 140 may simply comprise a further cylindrical member having a skirt 142 which is telescopically received around third cylindrical member 130 and an inwardly depending horizontal flange 144 which extends over the top edge of third cylindrical member 130 to engage the edge of the top surface of wafer 70.

Clamping means 140 not only secures wafer 70 to platform 60, but also, in cooperation with sealing means 66, permits formation of a chamber between platform 60 and the backside of wafer 70 into which gas may be pumped, via gas port 64 in platform 60 to provide a more efficient thermal connection between wafer 70 and platform 60.

As shown in FIG. 5, wafer 70 is first loaded onto platform 60 in chamber 10 while platform 60 is in a lowered position. Platform 60 is then raised to a point inside third cylindrical member 130 where flange 144 of clamping means 140 engages wafer 70 as shown in FIG. 2. Raising wafer 70 to this position within first cylindrical member 110 and third cylindrical member 130 generally defines a smaller zone 100 within chamber 10, wherein the reactive sputtering process takes place.

After wafer 70 has been raised to the position shown in FIG. 2, the reactive sputtering process may be commenced. At this time either a mixture of the reactive gas and the sputtering gas, or just the sputtering gas alone, is admitted into chamber 10 and a plasma is struck between target 30 and the grounded portions of chamber 10.

In accordance with the invention, the gases enter zone 100 from the outer portions of chamber 10 by passing through passageway 126 defined by the space between the top of second cylindrical member 120 and top wall 14 of chamber 10. The gases then travel downwardly in the space defined by the inner wall of second cylindrical member 120 and the outer wall of first cylindrical member 110 and then pass through second passageway 132 defined by the space between the bottom of first cylindrical member 110 and bottom wall 136. The gases then pass up through the space defined between the inner wall of first cylindrical member 110 and the outer wall of third cylindrical member 130 to emerge into zone 100 at a third passageway 138 between first cylindrical member 110 and third cylindrical member 130 adjacent clamping ring 140.

This tortuous path defined by cylindrical members 110, 120, and 130 for the reactive gas to enter zone 100 permits entry of a sufficient amount of the reactive gas to enter zone 100 to form the desired stoichiometric reaction product while inhibiting or restricting the migration of the resulting reaction product from zone 100 to deposit on other portions of chamber 10.

As shown in FIGS. 2, 5, and 6, first cylindrical member 110 may be further provided with an inwardly depending flange 112 to further restrict the backflow of the reaction product of the sputtered metal and the reactive gas out of zone 100.

It should be noted that while members 110, 120, and 130 have been described as cylindrical members, the use of other geometric shapes is not precluded as long as they are symmetrically positioned with respect to one another to ensure even gas flow and even distribution of gas into zone 100. Cylindrical members are preferred because even gas flow and even distribution of the gas into zone 100 can be maximized suing cylinders.

To further illustrate the invention, a titanium target was mounted in a reactive sputtering chamber provided with the reactive gas path just described through the three nested cylinders. A 125 mm silicon wafer was loaded onto a platform in the chamber which was then raised to a point where the clamping ring on the innermost cylinder engaged the edges of the top surface of the wafer.

The wafer was heated to a temperature of about 450° C. and the chamber was evacuated to a pressure of about $1 \times 10^{-8}$ Torr. 100 sccm of argon sputtering gas and 40 sccm of $N_2$ gas was admitted to the chamber and a plasma at a power level of about 5000 watts was struck between the target, which was maintained at an initial potential of about $-380$ volts.

The power supply controller was then activated to maintain the target voltage within a range of from about $-350$ to about $-380$ volts by monitoring the target voltage and reset the constant power level of the planar magnetron power source to maintain the target voltage within the stated range.

After 1 minute, the gas flow and power were shut off and the coated wafer was then removed from the chamber, sectioned, and examined under a scanning electron microscope, a stylus profilometer, a sheet resistance monitor, and a stress monitor. A 1000 Angstrom titanium nitride layer was found to have formed on the surface of the wafer, having a resistivity of about 50–80 micro-ohm-centimeters and a stress of less than $5 \times 10^9$ dynes/cm$^2$. The layer was analyzed by Rutherford Backscattering (RBS), Auger, and Sputtered Neutral Mass Spectroscopy (SMMS) analysis techniques and found to be a fully stoichiometric TiN layer, i.e., a single phase layer containing 50 atomic % titanium and 50 atomic % nitrogen.

The chamber walls outside of the cylindrical members were visually examined for deposits indicative of a failure of the cylindrical members to contain the titanium nitride reaction product while admitting the gaseous mixture of nitrogen and argon into the zone within the cylinders and between the target and the wafer. Little evidence of titanium nitride deposits was found on the chamber walls, indicating that the tortuous gas path defined by the nested cylindrical members had prevented the titanium nitride reaction product from migrating outside of the reaction zone between the target and the wafer.

Thus, the invention provides novel process and apparatus for reactive sputtering of a stoichiometric reaction product of a sputtered metal and a reactive gas by novel control of the target voltage through adjustment of the power level of a constant power source and novel means for controlling the flow of gas into the reaction zone between the target and the wafer on which the reaction product is formed to provide an adequate supply of the reactive gas while confiding deposition of the reaction product to the surfaces surrounding the reaction zone between the target and the wafer.

Having thus described the invention, what is claimed is:

1. An improved process for forming a layer of a stoichiometric metal compound on a semiconductor wafer by reactive sputtering a metal target in the presence of a reactive gas, wherein the improvement comprises: changing the negative potential on said metal target to increase or decrease the supply of sputtered metal atoms available to react with the atoms of reactive gas at a fixed flow of such gas by monitoring the target voltage and, in response to changes in the target voltage, changing the power level of a constant power source electrically connected to said target to return the target voltage level back to a condition where the stoichiometric ratio of said sputtered metal atoms and said reactive gas atoms adjacent said wafer to form said stoichiometric metal compound will be restored.

2. The process of claim 1 wherein the power level of said constant power source is changed by feeding back a target voltage monitoring signal to said power supply as a power level set signal to change the power level of the constant power source.

3. The process of claim 2 wherein the target voltage monitoring signal is amplified before being fed back to the power supply as a power level set signal.

4. The process of claim 2 wherein said metal being sputtered is selected from the class consisting of titanium, aluminum, silicon, tantalum, copper, and zinc; and said reactive gas is selected from the class consisting of nitrogen, oxygen, silane ($SiH_4$), and nitrous oxide ($N_2O$).

5. The process of claim 4 wherein said metal being sputtered comprises titanium, said reactive gas comprises nitrogen, and said stoichiometric metal compound comprises TiN.

6. The process of claim 2 wherein said power level is changed to maintain said target voltage within the range of from about $-250$ volts to about $-750$ volts.

7. The process of claim 2 wherein said power level is changed to maintain said target voltage within the range of from about $-300$ volts to about $-400$ volts.

8. The process of claim 2 wherein said power level is changed to maintain said target voltage within the range defined between points C and D on the graph of FIG. 3.

9. A process according to claim 1 wherein when the target voltage rises, a higher power set signal is fed back to the power supply, changing the constant power level to a higher level, whereby more metal is sputtered from said target, thereby lowering the target voltage back to the desired voltage level and in turn lowering the power level of the constant power source.

10. A process according to claim 9 wherein said metal is titanium.

11. An improved process for forming a layer of a stoichiometric metal compound on a semiconductor wafer by reactive sputtering a metal target in a chamber in the presence of a reactive gas, wherein the improvements comprise:
 (a) changing the negative potential on said metal target to maintain a stoichiometric supply of sputtered metal atoms available to react with the atoms of said reactive gas at a fixed flow of said gas by changing the power level of a constant power source electrically connected to said target; and
 (b) providing a path for the flow of said reactive gas to the zone between said target and said wafer, while restricting the travel of said stoichiometric metal compound from said zone;
to thereby provide a stoichiometric ratio of said sputtered metal atoms and said reactive gas atoms adjacent said wafer to form said stoichiometric metal compound on said wafer.

12. The process of claim 11 wherein said step of providing said path for said reactive gas further comprises providing a series of coaxially nested members surrounding the zone between said target and said wafer defining one or more gas passages between the members.

13. The process of claim 12 wherein said step of providing said path for said reactive gas further comprises providing a series of at least three coaxially nested members surrounding the zone between the target and the wafer, spacing the outermost and innermost members downwardly from the top wall of said chamber to respectively define an inlet passageway between the top wall of said chamber and said outermost member and an outlet passageway between said innermost member and said top wall, providing a bottom wall to join the bottom edges of said innermost and outermost members together; and depending the middle member downwardly from said top wall of said chamber to a point spaced above said bottom wall to thereby define a gas passage between said members.

14. An improved apparatus for forming a layer of a stoichiometric metal compound on a semiconductor wafer by reactive sputtering a metal target in the presence of a reactive gas, wherein the improvement comprises: means for monitoring the target voltage, and in response to changes in the target voltage, means for changing the power level of a constant power source electrically connected to said target to return the target voltage level back to a condition where the stoichiometric ratio of said sputtered metal atoms and said reactive gas atoms adjacent said wafer to form said stoichiometric metal compound will be restored.

15. The apparatus of claim 14 wherein said means for changing the power level of said constant power source further comprises means for feeding back a target voltage monitoring signal to said power supply as a power level set signal to change the power level of the constant power source.

16. The apparatus of claim 15 wherein said means for feeding back said target voltage monitoring signal to said power supply further comprises means for amplifying said voltage monitoring signal fed back to said power supply as a power level set signal.

17. The apparatus of claim 15 wherein said means for changing said power level further comprise means for maintaining said target voltage within the range of from about −250 volts to about −750 volts.

18. The apparatus of claim 12 wherein said means for changing said power level further comprise means for maintaining said target voltage within the range of from about −300 volts to about −400 volts.

19. The apparatus of claim 12 wherein said means for changing said power level further comprise means for maintaining said target voltage within the range defined between points C and D on the graph of FIG. 3.

20. The process of claim 14 wherein said metal target being sputtered is selected from the class consisting of titanium, aluminum, silicon, tantalum, copper, and zinc; and said reactive gas is selected from the class consisting of nitrogen, oxygen, silane ($SiH_4$), and nitrous oxide ($N_2O$).

21. The process of claim 20 wherein said metal target being sputtered comprises titanium, said reactive gas comprises nitrogen, and said stoichiometric metal compound comprises TiN.

22. The apparatus of claim 14 wherein said apparatus further comprises means for providing a path for the flow of said reactive gas to the zone between said target and said wafer, while restricting the travel of said stoichiometric metal compound from said zone.

23. The apparatus of claim 22 wherein said means for providing said path for said reactive gas further comprise a series of coaxially nested members surrounding the zone between said target and said wafer defining one or more gas passages between the members.

24. An apparatus according to claim 14 wherein when said means for monitoring said target voltage detects a voltage increase, a higher power set signal is fed back to the power supply, changing the constant power level to a higher level, whereby more metal is sputtered from said target, thereby lowering the target voltage back to the desired voltage level and in turn lowering the power level of the constant power source.

25. An apparatus according to claim 24 wherein said sputtered metal is titanium.

26. An improved apparatus for forming a layer of a stoichiometric metal compound on a semiconductor wafer by reactive sputtering a metal target in a chamber in the presence of a reactive gas, wherein the improvements comprise:
 (a) means for changing the negative potential on said metal target to restore the stoichiometry of the sputtered metal atoms available to react with the atoms of said reactive gas at a fixed flow of said gas to form said stoichiometric metal compound, comprising means for changing the power level of a constant power source electrically connected to said target; and
 (b) means for providing a path for the flow of said reactive gas to a zone between said target and said wafer, while restricting the travel of said stoichiometric metal compound from said zone to other portions of said chamber;
to thereby provide a stoichiometric ratio of said sputtered metal atoms and said reactive gas atoms adjacent said wafer to form said stoichiometric metal compound on said wafer.

27. The apparatus of claim 26 wherein said means for providing said path for said reactive gas further comprise a series of coaxially nested members surrounding said zone between said target and said wafer defining one or more gas passages between said members.

28. The apparatus of claim 27 wherein said means for providing said path for said reactive gas further comprise a series of at least three coaxially nested members surrounding the zone between the target and the wafer, comprising:
   (a) outermost and innermost members spaced downwardly from the top wall of said chamber to respectively define an inlet passageway between the top wall of said chamber and said outermost member and an outlet passageway between said innermost member and said top wall;
   (b) a bottom wall joining the bottom edges of said innermost and outermost members together; and
   (c) a middle member depending downwardly from said top wall of said chamber to a point spaced above said bottom wall;
to thereby define a gas passage between said members from the portion of said chamber outside said members to said zone within said members.

29. Apparatus for reactive sputtering of a layer of a stoichiometric metal compound on a semiconductor wafer formed by reaction between a sputtered metal and a reactive gas, comprising:
   (a) a vacuum chamber having a top wall;
   (b) a metal target mounted adjacent said top wall of said chamber;
   (c) means for retaining a circular semiconductor wafer in said chamber in a position below said target and generally axially aligned therewith;
   (d) a first cylinder having an upper end mounted to said top wall of said chamber and depending downwardly below said target and generally symmetrically surrounding said target;
   (e) a second cylinder generally coaxially surrounding said first cylinder and having an upper end spaced from said said top wall to define a first passageway therebetween and a lower end depending downwardly beyond a lower end of said first cylinder;
   (f) support means in said chamber to support said second cylinder in said chamber in said position coaxially surrounding said first cylinder;
   (g) a third cylinder coaxially positioned within said first cylinder having an inner diameter slightly larger than said semiconductor wafer and having an upper end spaced from said top wall of said chamber to define a second passageway therebetween and a lower end depending down approximately the same distance as said lower end of said second cylinder;
   (h) a circular bottom wall joined to said lower ends of said second and third cylinders to seal off the space therebetween;
whereby a gas passage will be defined leading from the space in said chamber outside of said second cylinder through said first passageway into the space between said first and second cylinders, then down around said lower end of said first cylinder and to the space between said first and third cylinders and then through said second passageway to permit said reactive gas to emerge adjacent said wafer to react with said sputtered metal to form said coating on said wafer.

30. The apparatus of claim 29 wherein said first cylinder has a flange mounted to said lower end to depend inwardly toward the outer wall of said third cylinder to provide a flow impediment to back flow of the reaction product of said sputtered metal and reactive gas to avoid contamination of the remainder of said chamber outside of said cylinders.

31. The apparatus of claim 30 wherein said flange is mounted to said lower end of said first cylinder generally perpendicular to the wall of said cylinder.

32. The apparatus of claim 29 wherein said third cylinder has a clamping ring carried at the upper end of said cylinder to engage the outer edge of said wafer.

* * * * *